(12) United States Patent  
Rusli

(10) Patent No.: US 9,812,347 B2
(45) Date of Patent: Nov. 7, 2017

(54) SEMICONDUCTOR DEVICE AND METHOD

(71) Applicant: Chip Solutions, LLC, Phoenix, AZ (US)

(72) Inventor: Sukianto Rusli, Phoenix, AZ (US)

(73) Assignee: CHIP SOLUTIONS, LLC, Phoenix, AZ (US)

( * ) Notice: Subject to any disclaimer, the term of this patent is extended or adjusted under 35 U.S.C. 154(b) by 0 days.

(21) Appl. No.: 15/211,631

(22) Filed: Jul. 15, 2016

(65) Prior Publication Data

US 2017/0018526 A1    Jan. 19, 2017

Related U.S. Application Data

(60) Provisional application No. 62/231,814, filed on Jul. 15, 2015, provisional application No. 62/388,023, filed on Jan. 14, 2016.

(51) Int. Cl.
H01L 23/00 (2006.01)
H01L 21/683 (2006.01)
(Continued)

(52) U.S. Cl.
CPC ........ *H01L 21/6835* (2013.01); *H01L 21/486* (2013.01); *H01L 21/4846* (2013.01);
(Continued)

(58) Field of Classification Search
CPC . H01L 2224/13147; H01L 2224/13155; H01L 2224/11462; H01L 24/81; H01L 23/49827; H01L 23/3192; H01L 2224/0558; H01L 23/53238; H01L 21/563; H01L 24/16; H01L 2924/01028; H01L 2224/16237; H01L 2224/81191; H01L 2924/00014; H01L 2924/0002; H01L 21/486; H01L 21/565; H01L 21/6835; H01L 23/3107; H01L 23/49894; H01L 24/08; H01L 2924/01029; H01L 23/49838; H01L 2224/45147; H01L 2224/821; H01L 23/49822; H01L 2221/68318; H01L 24/82; H01L 2224/16227; H05K 3/244; H05K 2201/09481

See application file for complete search history.

(56) References Cited

U.S. PATENT DOCUMENTS 6,140,702 A    10/2000 Efland et al.
7,147,740 B2    12/2006 Takayama et al.
(Continued)

FOREIGN PATENT DOCUMENTS

WO    2015073047 A1    5/2015

*Primary Examiner* — Jasmine Clark
(74) *Attorney, Agent, or Firm* — Schmeiser, Olsen & Watts LLP

(57) ABSTRACT

Disclosed herein is a semiconductor device that includes a semiconductor die and a substrate including a first surface and a second surface. The substrate includes a conductive circuit and an insulative material over the conductive circuit. The semiconductor die is attached to the second surface. The semiconductor device further includes an interconnect joint structure in the substrate creating a capture pad including a middle copper layer, an adjacent top nickel layer, and an adjacent bottom nickel layer. A method for making a semiconductor device is further disclosed.

20 Claims, 20 Drawing Sheets

(51) Int. Cl.
*H01L 21/48* (2006.01)
*H01L 21/56* (2006.01)
*H01L 23/31* (2006.01)
*H01L 23/498* (2006.01)

(52) U.S. Cl.
CPC .......... *H01L 21/563* (2013.01); *H01L 21/565* (2013.01); *H01L 21/568* (2013.01); *H01L 23/3107* (2013.01); *H01L 23/3121* (2013.01); *H01L 23/49838* (2013.01); *H01L 23/49894* (2013.01); *H01L 24/08* (2013.01); *H01L 24/16* (2013.01); *H01L 24/17* (2013.01); *H01L 24/81* (2013.01); *H01L 24/82* (2013.01); *H01L 23/49822* (2013.01); *H01L 23/49827* (2013.01); *H01L 2221/68318* (2013.01); *H01L 2221/68345* (2013.01); *H01L 2221/68359* (2013.01); *H01L 2221/68381* (2013.01); *H01L 2224/0801* (2013.01); *H01L 2224/08501* (2013.01); *H01L 2224/13147* (2013.01); *H01L 2224/16227* (2013.01); *H01L 2224/16235* (2013.01); *H01L 2224/81455* (2013.01); *H01L 2224/821* (2013.01); *H01L 2224/82896* (2013.01); *H01L 2924/15747* (2013.01)

(56) References Cited

U.S. PATENT DOCUMENTS

| | | | |
|---|---|---|---|
| 7,836,586 | B2 | 11/2010 | Bayan et al. |
| 8,176,627 | B2 | 5/2012 | Kobayashi |
| 9,462,704 | B1 | 10/2016 | Hiner et al. |
| 2006/0223230 | A1 | 10/2006 | Hsu et al. |
| 2007/0035023 | A1* | 2/2007 | Ano ................ H01L 23/498 257/738 |
| 2009/0140419 | A1* | 6/2009 | Rhyner ............ H01L 23/49838 257/737 |
| 2010/0051189 | A1 | 3/2010 | Kawabata et al. |
| 2011/0147924 | A1* | 6/2011 | Kaneko ............ H01L 23/49816 257/737 |
| 2012/0049345 | A1* | 3/2012 | Railkar ............ H01L 23/3677 257/737 |
| 2012/0187568 | A1 | 7/2012 | Lin et al. |
| 2012/0234589 | A1* | 9/2012 | Furuichi ............ H05K 3/4682 174/261 |

* cited by examiner

SEMICONDUCTOR DEVICE AND METHOD

CROSS-REFERENCE TO RELATED APPLICATIONS

This application claims the benefit of U.S. Provisional Application No. 62/231,814 filed Jul. 15, 2015, and U.S. Provisional Patent Application No. 62/388,023 filed Jan. 14, 2016, each of which is incorporated herein by reference in its entirety.

FIELD OF THE TECHNOLOGY

The subject matter disclosed herein generally relates to the fabrication of semiconductor devices. More particularly, the subject matter relates to a semiconductor device having a layered interconnect structure.

BACKGROUND

In known wafer level packaging (WLP) processes, a carrier wafer may be laminated to dicing tape and known good die are placed face down. The wafer may then be compression molded to encapsulate it and then the wafer carrier and tape may be removed. The molding compound may then be used to carry the fan-out area and to protect the chip backside. Redistribution layers may be created on the exposed die faces, the I/O may be rerouted, solder balls may be placed, and the die may be singulated. In other conventional non wafer level processes, methods include slicing the wafer into individual die and then packaging them.

Few semiconductor packaging and assembly techniques currently utilize embedded conductive circuits. When utilized, most embedded circuit implementations include a conductive circuit layer that is patterned onto a surface of a metal core base layer. A dielectric material is then layered onto the conductive circuit followed by the application of a thin layer of conductive layer. This foil is then etched to complete the circuit.

However, there are various limitations inherent in these known processes. Therefore, improved layering structures for semiconductor devices would be well received in the art.

SUMMARY

According to one embodiment, a semiconductor device comprises: a semiconductor die; a substrate including a first surface and a second surface, the substrate comprising a conductive circuit and an insulative material over the conductive circuit, wherein the semiconductor die is attached to the second surface; and an interconnect joint structure in the substrate creating a capture pad including a middle copper layer, an adjacent top nickel layer, and an adjacent bottom nickel layer.

According to another embodiment, a semiconductor device comprises: a semiconductor die; a substrate including a first and a second surface, the second surface attached to the semiconductor die, the substrate comprising a conductive circuit and an insulative material over the conductive circuit; and an interconnect joint structure in the substrate including a middle copper layer, an adjacent top nickel layer, and an adjacent bottom nickel layer, wherein the interconnect joint structure is found within a single layer of the insulative material.

According to another embodiment, a method for making a semiconductor device comprises: providing a substrate including conductive circuit and an insulative material over the conductive circuit; and forming a capture pad in the substrate including a first layer of nickel, a layer of copper over the first layer of nickel, and a second layer of nickel over the layer of copper.

BRIEF DESCRIPTION OF THE DRAWINGS

The subject matter which is regarded as the invention is particularly pointed out and distinctly claimed in the claims included at the conclusion of this specification. The foregoing and other features and advantages of the invention are apparent from the following detailed description taken in conjunction with the accompanying drawings in which:

DETAILED DESCRIPTION

A detailed description of the hereinafter-described embodiments of the disclosed apparatus and method are presented herein by way of exemplification and not limitation with reference to the Figures.

Figure 1:
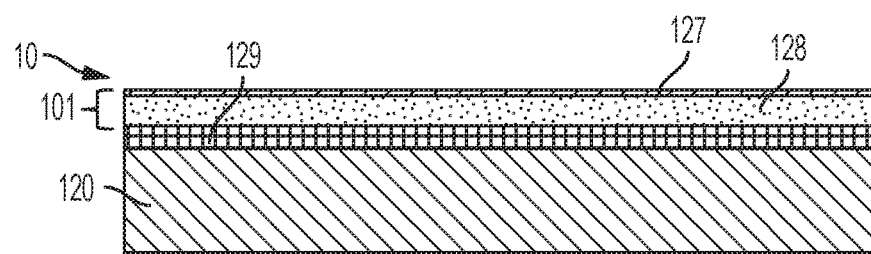
FIG. 1 depicts a side cutaway view of a step of a fabrication process according to one embodiment.
Figure 2:
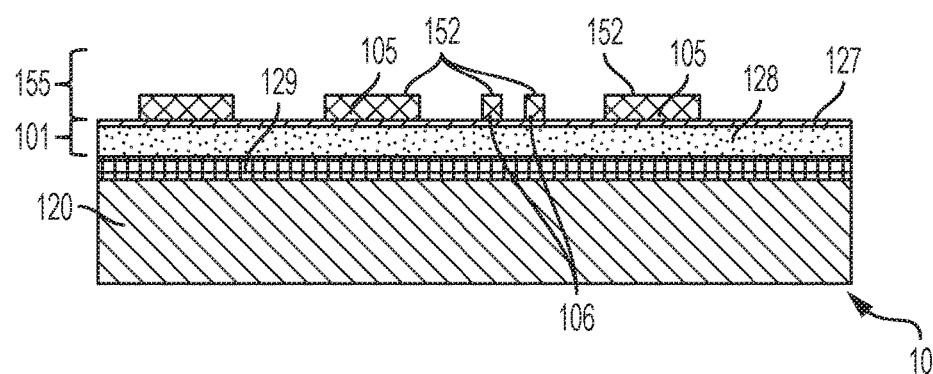
FIG. 2 depicts a side cutaway view of another step of the fabrication process of FIG. 1 according to one embodiment.

Referring to FIGS. 1-12, a fabrication process for the creation or fabrication of a semiconductor device 100 is shown. The fabrication process is shown in FIG. 1 to include a step of providing a releasable carrier 120 that is attached to conductive layers 101 to create a carrier structure 10. The conductive layers 101 may include a combination of a carrier foil 128 and a thin foil 127. The carrier foil 128 may be a thicker conductive layer and the thin foil 127 may be a thin conductive layer. An adhesive layer 129 may be located between the carrier 120 and the conductive layers 101. Embodiments of the releasable carrier 120 and the conductive layers 101 combination are shown in the exploded views provided by FIGS. 19-20.

Figure 18:
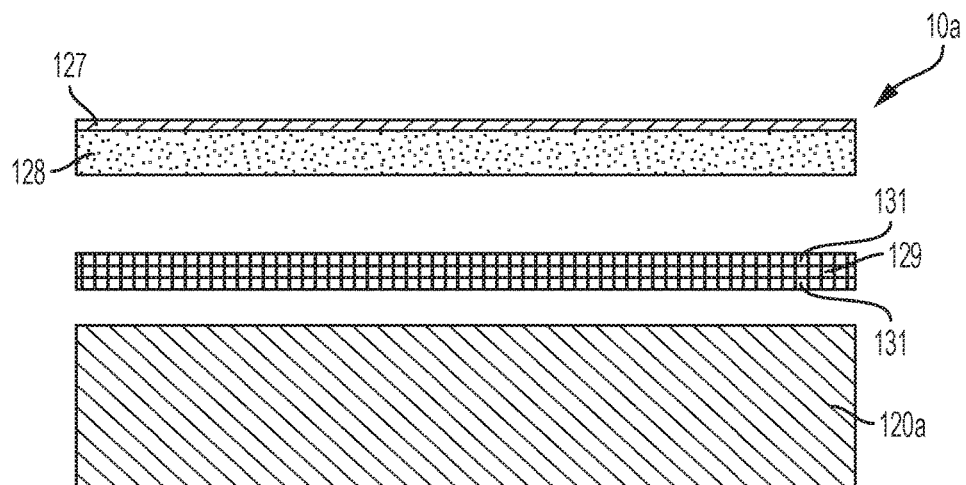
FIG. 18 depicts an exploded view of layers of a carrier structure in accordance with one embodiment.
Figure 19:
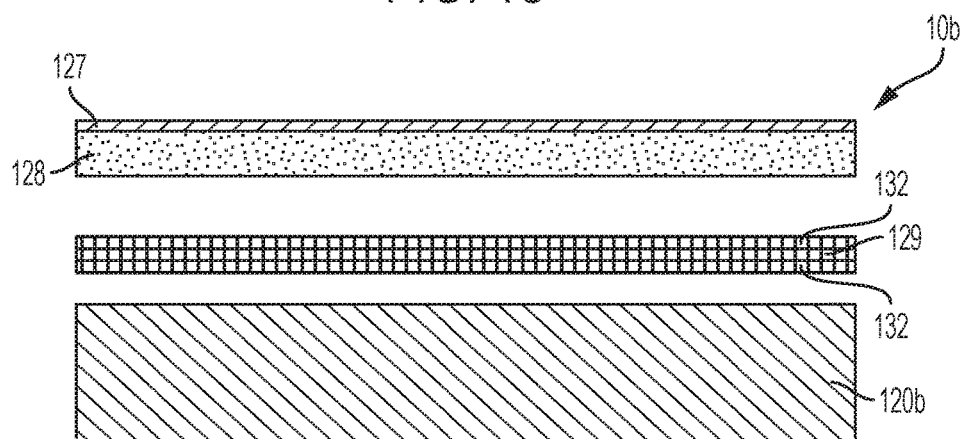
FIG. 19 depicts an exploded view of layers of another carrier structure in accordance with one embodiment.

FIG. 18 shows a carrier structure 10a having a releasable carrier 120 that may be a metal or core carrier 120a. FIG. 19 shows a carrier structure 10b having a glass releasable carrier 120b. Glass may be a preferred material for the releasable carrier 120 because it is extremely flat, thermally and dimensionally stable, and has a low coefficient of thermal expansion. However, other materials may have other advantages. The releasable carrier 120 may be a glass carrier, a metal core carrier, a clad core carrier, a laminate carrier, an aluminum carrier, a copper carrier, or a stainless steel carrier, an organic reinforced core carrier a ceramic material or combinations thereof. These carrier materials are exemplary. Further, the releasable carrier 120 may have varying thicknesses and may extend over varying areas. It should be understood that the concepts described herein may be applicable to any panel size format (e.g. 500 mm×500 mm). Further, the releasable carrier 120 may be a made from a material that is dimensionally stable, stiff and flat. These three characteristics may be particularly advantageous during the rest of the described fabrication process. Further, because the releasable carrier 120 may be reused for a second fabrication process after being released in the manner described herein, the releasable carrier 120 may be fashioned in a thicker manner, as the reusability of the releasable carrier 120 may preclude the engineering need to reduce material cost as would be required for one-off carriers.

To create or fabricate the carrier structure 10, the adhesive layer 129 may be applied to one of the releasable carrier 120 or the conductive layers 101 in a first step. The other of the releasable carrier 120 or the conductive layers 101 may then be attached. The adhesive layer 129 may include one or more layers such as a base with adhesive on one or both sides of the base (i.e. a double-sided tape).

As shown in FIG. 18, the adhesive layer 129 may include a thermal sensitive adhesive 131 on one or both sides of a double-sided tape. The thermal sensitive adhesive 131 may be configured to have a reduced adhesive capacity when exposed to high temperatures from, for example, a heat source. This may allow the thermal sensitive adhesive 131 to release when exposed to heat. For example, the activating heat source may be configured to raise the temperature of the thermal sensitive adhesive 131 to a temperature between 150 and 300° C. For example, in one embodiment, the temperature of the thermal activating source may be set to 250° C. with the release temperature of the thermal sensitive adhesive 131 being in the range of 180° C. and 220° C.

Figure 21:
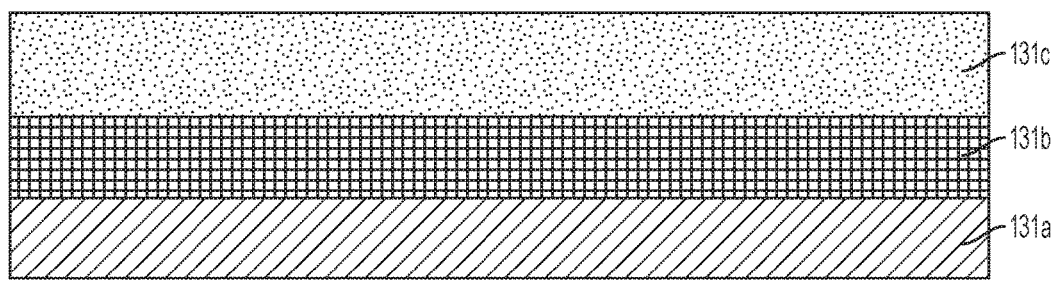
FIG. 21 depicts a thermal release film in accordance with one embodiment.
Figure 22:
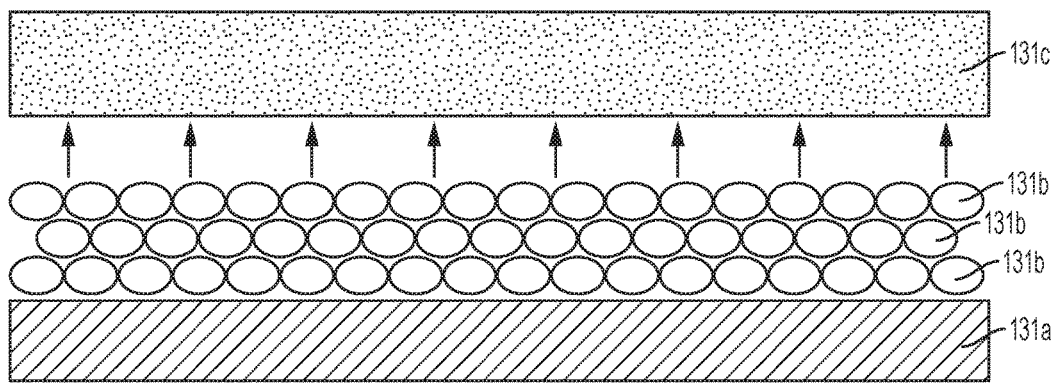
FIG. 22 depicts the thermal release film of FIG. 21 after activation in accordance with one embodiment.

One embodiment of a structure of the thermal sensitive adhesive 131 is shown in FIGS. 21 and 22. FIG. 21 shows the thermal sensitive adhesive 131 prior to activation. FIG. 22 shows the thermal sensitive adhesive 131 after activation. The thermal sensitive adhesive 131 may include a backing layer 131a. A thermal release adhesive layer 131b may be layered above the backing layer 131a. A substrate layer 131c may be attached to the thermal release adhesive layer 131b. The substrate layer 131c may be any particular substrate such a release film liner. Thus, the thermal release adhesive layer 131 may be activated by heat from a heat source to create the release. The thermal release adhesive layer 131b may include expandable molecules that expand when exposed to increased temperatures. Such expansion may reduce the tendency for adhesion of the molecules to provide for the thermal release of the thermal sensitive adhesive 131.

Alternatively, the adhesive layer 129 may include a UV sensitive adhesive 132 on one or each side of a double-sided tape, as shown in FIG. 19. The UV sensitive adhesive 132 may be configured to have a reduced adhesive capacity when exposed to a UV light source. This may allow the UV sensitive adhesive 132 to release when exposed to the UV light source. For example, the UV light activation source (not shown) may be a UV light source generating irradiation energy between 20 mW/cm$^2$ and 40 mW/cm$^2$. In the embodiment where a UV sensitive adhesive is utilized, it may be particularly advantageous to use a glass material for the releasable carrier 120. The transparent nature of glass may allow the UV sensitive adhesive to be exposed to the UV light activation source through the glass of the releasable carrier 120.

Figure 20:
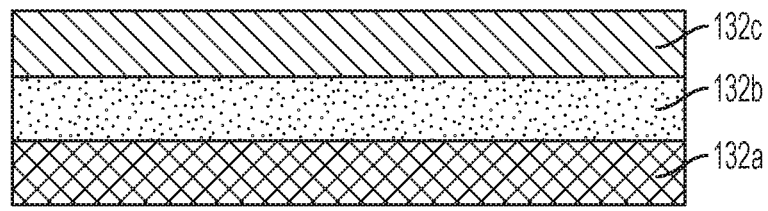
FIG. 20 depicts a UV release film in accordance with one embodiment.

One embodiment of a structure of the UV sensitive adhesive 132 is shown in FIG. 20. The UV sensitive adhesive 132 may include a polyolefin film layer 132a. A UV curing acrylic adhesive layer 132b may be layered above the polyolefin film layer 132a. A polyester film release liner 132c may be layered above the UV curing acrylic adhesive layer 132b. Thus, the UV curing acrylic adhesive layer 132b may be the layer that is activated by the UV source to create the release from the liner layers 132a, 132c. The thickness of the middle UV curing acrylic adhesive layer 132b may be thinner than the liner layers 132a, 132c. In one embodiment, the UV curing acrylic adhesive layer 132b may be 3-10 µm, while the combination of the liner layers 132a, 132c may each be 60-100 µm. In one embodiment, the UV curing acrylic adhesive layer 132b may be 8 µm or 5 µm while the liner layers 132a may be 80 µm.

In other embodiments, the double-sided tape may include two different adhesives, one on each side. For example, the double-sided tape may include a thermal sensitive adhesive on one side and a UV sensitive adhesive on the other. In still another embodiment, the double-sided tape may include a UV sensitive adhesive on one side and a no-release adhesive on the other side. In another embodiment, a pressure sensitive adhesive may be applied to one side of the double-sided tape while the other side includes the UV sensitive adhesive or the thermal sensitive adhesive. It should be understood that different adhesive combinations are contemplated for the double-sided tape in order to accomplish different release circumstances depending on the engineering requirements of a particular process or fabrication.

Attached to the releasable carrier 120 with the adhesive layer 129 are the conductive layers 101. The conductive layers 101 may include both the carrier foil 128 and the thin foil 127. The carrier foil 128 may be releasable from the thin foil 127 by mechanically pulling the carrier foil 128 from the thin foil 127 to expose the thin foil 127. In other embodiments, adhesives or a double-sided tape may be applied between the carrier foil 128 and the thin foil 127 which may release the carrier foil 128 from the thin foil 127 in a manner similar or the same as the releasable carrier 120 releases from the conductive layers 101 with the adhesive layer 129. The carrier foil 128 may be a thicker layer than the thin foil 127. In one embodiment, the carrier foil 128 may be 50 µm-70 µm. In one embodiment, the thin foil 127 may be between 1 µm and 5 µm. However, these thicknesses are exemplary and thicker or thinner layers may be appropriate in some embodiments.

Figure 29:
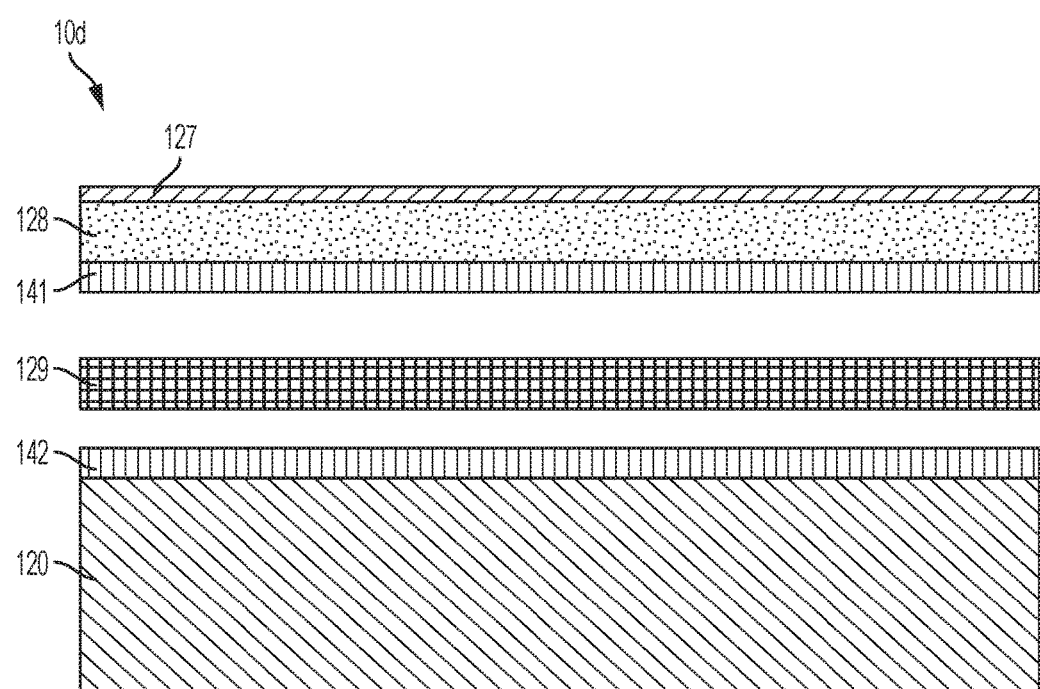
FIG. 29 depicts an exploded view of layers of another carrier structure in accordance with one embodiment.
Figure 30:
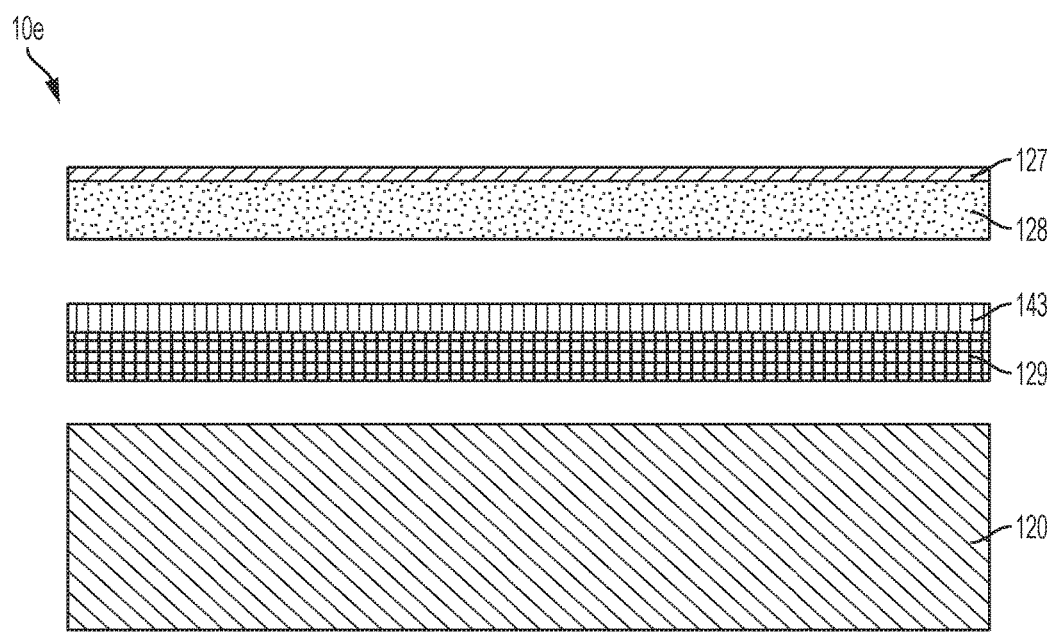
FIG. 30 depicts an exploded view of layers of another carrier structure in accordance with one embodiment.

Referring now to FIG. 29, still another embodiment of a carrier structure 10d is shown whereby the releasable carrier 120 includes a thermal barrier coating 142 applied to the releaseable carrier 120 between the releaseable carrier 120 and the adhesive layer 129. The thermal barrier coating 142 may be configured to prevent the loss of adhesion for the adhesive layer 129 as a result of elevated temperatures that might occur in other steps of the assembly processing (e.g. during reflow). Furthermore, FIG. 29 shows that a second barrier release coating 141 is applied to the carrier foil 128 between the carrier foil 128 and the adhesive layer 129. Another barrier release coating (not shown) may be applied to an undersurface of the carrier as well to act as a thermal barrier at this location in the carrier structure. Referring to FIG. 30, another embodiment is shown where a third thermal barrier coating 143 is applied to the top of the adhesive layer 129 between the adhesive layer 129 and the carrier foil 128.

The thermal barrier coatings 141, 142, 143 may be applied as a layer between any release interface in the carrier structure 10. Both sides of the adhesive layer 129 may include a thermal barrier coating. The thermal barrier coatings 141, 142, 143 may be micron size fillers that may be applied to appropriate layers of the carrier structure 10 and more specifically the adhesive layer 129. These filler particles may be hollow ceramic insulative spheres in one embodiment. The thermal barrier coatings 141, 142, 143 may be adjusted to the desired thickness to provide the necessary protection for the layers of the carrier structure 10 and the thermal sensitive adhesive 131 (or the UV, pressure sensitive, or other adhesives described above). The thermal barrier coatings 141, 142, 143 may be applied by various methods such as thermal spray.

Figure 25:
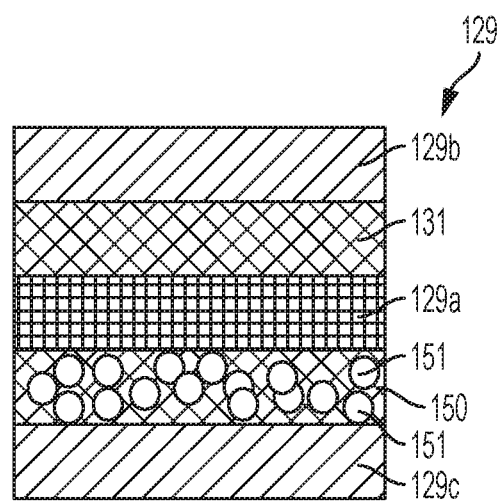
FIG. 25 depicts a thermal adhesive tape in accordance with one embodiment.

Referring to FIG. 25, it is contemplated that the thermal barrier material may be combined or mixed with an adhesive in a combined adhesive/barrier layer, rather than two separate layers. In this embodiment, a version of the adhesive layer 129 is shown including a double sided tape having a polyester base material layer 129a located between a thermal sensitive adhesive 131 and a pressure sensitive adhesive 150. The pressure sensitive adhesive 150 may include thermal barrier fillers 151 in a combined manner. The thermal barrier fillers 151 may be mixed with the pressure sensitive adhesive 150. The thermal barrier fillers 151 may be formulated in the form of hollow ceramic spheres in one embodiment that may be configured to act as an insulator. These thermal barrier fillers 151 may be mixed with any of the adhesives (thermal, UV, pressure) in this manner. In this version the double sided tape further includes a first release liner 129b layered on top of the thermal sensitive adhesive 131 and a second release liner 129c layered below the pressure sensitive adhesive 150. These release liners 129b, 129c may be utilized on any embodiment of the carrier structure 10 described herein and may be removed when applying the double sided tape to the carrier structure 10 during the fashioning of the carrier structure 10 prior to a circuit or semiconductor device fabrication process.

Whatever the embodiment, the releasable carrier 120 may be configured to release from the rest of the carrier structure 10 from the conductive layers 101 when exposed to an activating source, such as a UV source or a heat source as described herein above. The activating source may require no physical contact with the releasable carrier 120 to activate the adhesive layer 129 and release the releasable carrier in a manner consistent with that described herein. Further, the activating source may be a non-mechanical activating source and may create a clean release such that the releasable carrier 120 is reusable for additional fabrication processes. Further, the releasable carrier 120 may include three release points: a first release point between the thin foil 127 and the carrier foil 128; a second release point between the carrier foil 128 and the adhesive layer 129 or releasable tape; and a third between the releasable carrier 120 and the adhesive layer 129 or releasable tape.

It should further be understood that the carrier structures described herein may be used on any panel size or format, from wafer to large panel processes. Further the carrier structures described herein may be used on standard build up processes or sputtering methods. Further, the carrier structures may expand fan out wafer level packaging to sizes beyond the current 12" diameter standard. Moreover, the carrier structures may be capable for any panel size format including rectangular, square or circular. Further, the carrier structures and accompanying methods described herein may be compatible with wirebond, flip chip, integrated passive devices, conventional passives and multi-die structures.

Referring back to the process of FIGS. 1-12, FIG. 2 shows another step in the fabrication process. Once the releasable carrier 120 has been provided (with or without the openings 103), a substrate 155 may begin to be built upon the releasable carrier 120, as shown in FIGS. 3-6. In the first step of building this substrate 155, shown in FIG. 3, a conductive circuit 152 may be applied. The conductive circuit 152 may include a plurality of die attach pads 105 and a plurality of traces 106. The die attach pads 105 and the traces 106 may each be plated conductive elements. The conductive circuit 152 may be applied atop the layer of the thin foil 127 while the releasable carrier 120 remains attached. The conductive circuit 152 is not limited to these elements and may include any appropriate conductive elements, portions or the like. The conductive circuit 152 may be a redistribution layer (RDL) and may be formed with RDL patterning with semi-additive plating.

Figure 3:
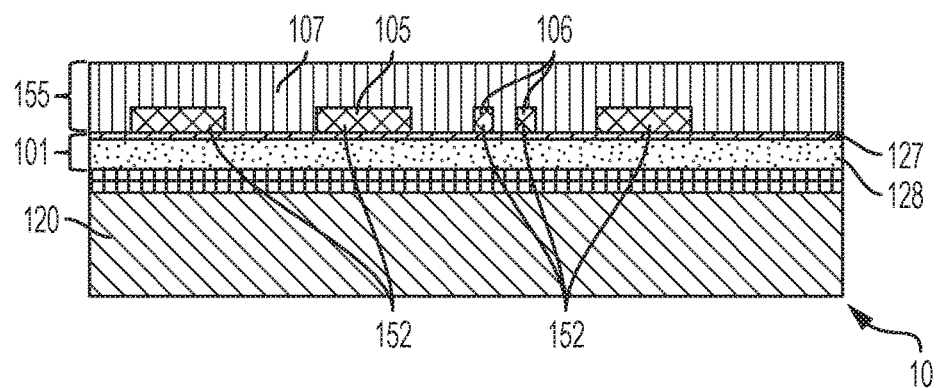
FIG. 3 depicts a side cutaway view of another step of the fabrication process of FIGS. 1-2 according to one embodiment.

Referring now to FIG. 3, another step of the fabrication process is shown. The fourth step includes laminating the conductive circuit 152 with an insulative material 107 to encapsulate the conductive circuit 152. The insulative material 107 may be a photo-imageable dielectric (PID) in one embodiment. In others, the insulative material 107 may be an ABF film. In still other embodiments, as described hereinbelow with respect to FIG. 26, the insulative material 107 may be a mold compound. The insulative material may be any dielectric material used for creating substrate layers on conductive circuits for semiconductor and printed circuit board (PCB) processes. The insulative material 107 may have an adjustable thickness depending on the embodiment.

It should be understood that the conductive circuit 152 may be referred to herein as an "embedded circuit." "Embedded," as defined herein, means a process or product where a conductive circuit or layer is built in adjacent contact with a conductive layer, the conductive layer being etched away or otherwise removed to complete the conductive circuit of the substrate. Prior to etching, the thin foil sheet would short any circuit upon which the embedded substrate is built. In each of these "embedding" processes, the conductive layer is etched away to complete the functional conductive circuit.

Figure 4:
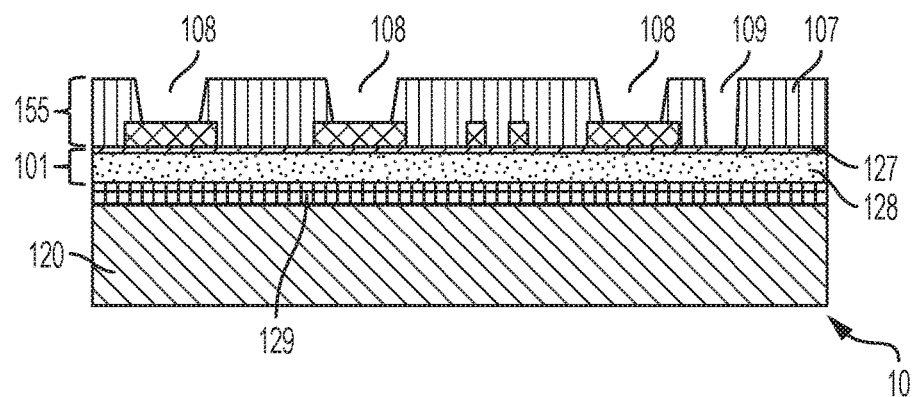
FIG. 4 depicts a side cutaway view of another step of the fabrication process of FIGS. 1-3 according to one embodiment.

Referring now to FIG. 4, another step of the fabrication process is shown. At this stage, the insulative material 107 (e.g. PID) may be patterned. The patterning of the insulative material 107 may include one or more patterned structures 108 exposing a die attach pads 105 or patterned structures 109 exposing the thin foil 127 conductive layer. As shown, multi-tier openings may be defined in the insulative material 107. A chip, such as semiconductor die 112 (shown in FIG. 6) may also be placed on this stage with solder balls or copper pillars connecting to the circuits 152 within the patterned structures 108. Alternatively, the chip, such as semiconductor die 112, may be placed as shown in FIG. 6.

Figure 5:
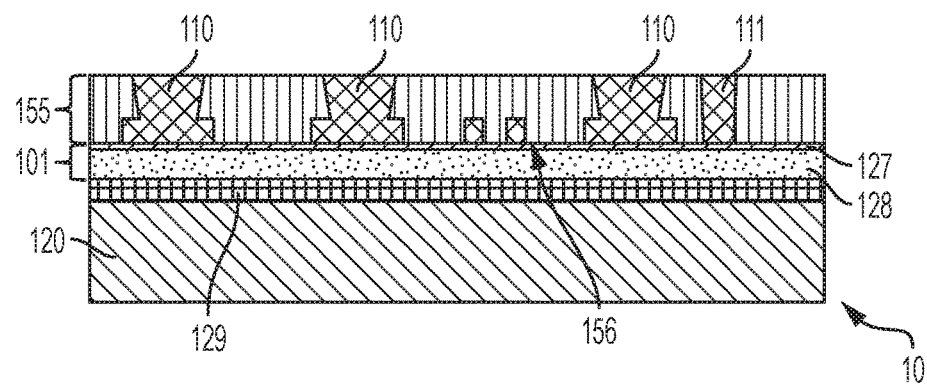
FIG. 5 depicts a side cutaway view of another step of the fabrication process of FIGS. 1-4 according to one embodiment.

In FIG. 5, another step of the fabrication process is shown where the patterned structures 108, 109 may be filled with more conductive material, such as copper. In the embodiment shown, a plurality of copper plated filled vias 110 are shown filling the patterned structures 108. A copper plated structure 111 above the unpatterned thin foil 127 filled the patterned structure 109. The structures 110, 111 are each flush with the surface of the insulative material 107. At this point, the completed substrate layer 155 has been defined above the layer of thin foil 127. The substrate 155 includes a first surface 156 and a second surface 157. From here, it should be understood that multi-layer circuits may be fabricated above the substrate layer 155 by repeating the circuit patterning process using known build up or transfer methods. The embodiment described in FIGS. 1-12 includes the single substrate 155 but it should be understood that this is exemplary.

Once the substrate layer 155 is completed, before the next step, the electrical and/or mechanical properties of each die attach location may be tested or viewed with a vision system to determine good known die attach locations. This vision testing may be accomplished before the conductive circuit 152 is etched or completed and while the thin foil layer 127 remains attached. The insulative material 107 may be comprised of PID material to facilitate the imaging at this stage prior to attachment of the semiconductor die 112. The imaging may determine whether the elements of the conductive circuit are ready for placement or are instead defective. It should be understood that the view shown in FIGS. 1-12 are for a single die attach location, but that the substrate may continue to the left and right (along with into and out of the page) relative to the cross section shown to provide for additional die attach locations.

Figure 6:
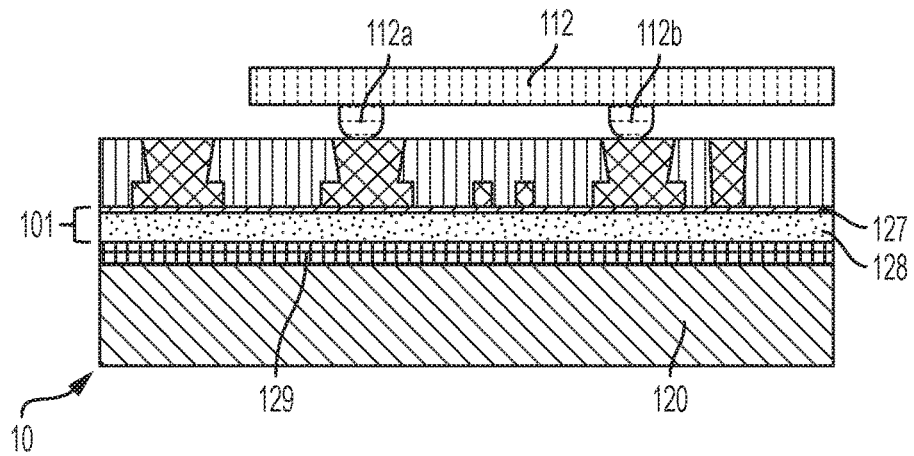
FIG. 6 depicts a side cutaway view of another step of the fabrication process of FIGS. 1-5 according to one embodiment.

Referring now to FIG. 6, a semiconductor die 112 may then be attached to the second surface 157 of the substrate layer 155. The semiconductor die 112 may be a flip chip or any other type of die and may include interconnects 112a, 112b. The interconnects 112a, 112b may be copper pillars or solder balls. The die placement and die redistribution of the semiconductor die 112 may be completed using pick and place tools. However, other die attach techniques may be required depending on the die pitch design and corresponding registration requirement. Flux application by dipping may also be incorporated during the pick and place. Other flux dispensing methods are possible in the placement process as well. Reflow may include utilizing a non conveyorized convention oven for large panel processes.

Thus, the conductive circuit 152 may include a first element 160 having a first portion such as the structure 110 in physical contact with the semiconductor die 112 and at least substantially coplanar with the second surface 157 of the insulative material and the substrate 155. The first element 160 may further include a second portion or structure, such as the die attach pad 105, that is at least substantially co-planer with the first surface 156 of the substrate 155. The first structure 110 and the second structure, such as die attach pad 105, may have different geometries.

Figure 7:
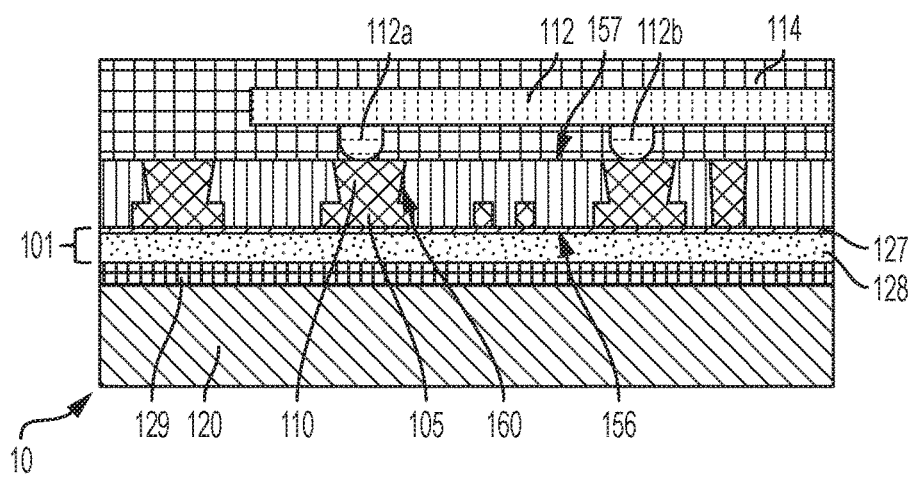
FIG. 7 depicts a side cutaway view of another step of the fabrication process of FIGS. 1-6 according to one embodiment.

Referring now to FIG. 7, another step of the fabrication process is shown. The eighth step may include molding the die onto the substrate 155 and the carrier structure 10 with a mold compound 114. Mold sheets, powder or liquid molding compounds or systems may be used depending on the package requirements for the mold compound 114. Capillary underfill (CUF) is also an option rather than mold underfill (MUF). The mold compound 114 encapsulating the semiconductor die 112 may be a dielectric material instead of a mold material (e.g. ABF film), in other embodiments. Thus, the semiconductor die 112 may be attached to the substrate 155 and encapsulated with the mold 114 before the releasable carrier 120 is removed from the substrate 155 and the conductive layers 101.

Figure 8:
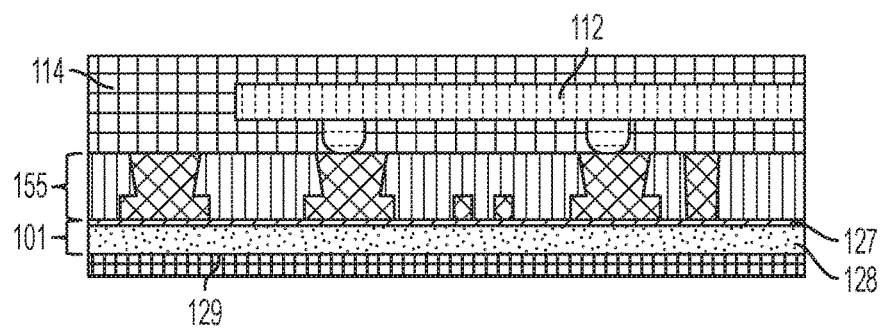
FIG. 8 depicts a side cutaway view of another step of the fabrication process of FIGS. 1-7 according to one embodiment.

Referring to FIG. 8, the next step may include releasing the releasable carrier 120 from the conductive layers 101 and the substrate 155. The releasable carrier 120 may be removed by peeling. However, the release of the releasable carrier 120 may be facilitated by an activating source as described hereinabove. Thus, no mechanical peeling may be necessary if the level of adhesive is reduced to the point where the carrier 120 falls away from the conductive layers 101 and the substrate 155.

Figure 9:
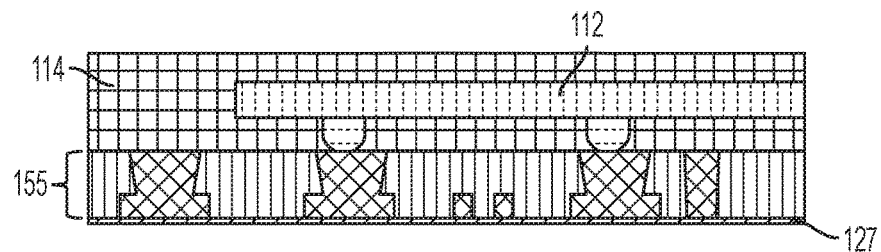
FIG. 9 depicts a side cutaway view of another step of the fabrication process of FIGS. 1-8 according to one embodiment.

Referring now to FIG. 9, once the releasable carrier 120 is released from the conductive layers 101, the carrier foil 128 may be released from the thin foil 127. This may be accomplished by peeling. Because the carrier foil 128 may be thin relative to the releasable carrier 120 and may not require release facilitation with an activating source like the releasable carrier 120.

Figure 10:
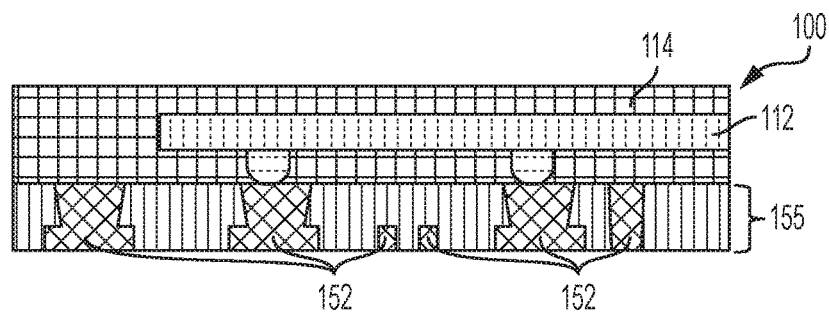
FIG. 10 depicts a side cutaway view of another step of the fabrication process of FIGS. 1-9 according to one embodiment.

As shown in FIG. 10, once the assembled package is separated from the releasable carrier 120, the remaining thin foil 127 may be removed by etching to expose the embedded RLD circuits in the insulative material 107 in a tenth step in the fabrication process. This etching may form an etched layer 158 of the thin foil 127 conductive material. Thus, at this stage the conductive circuit 152 and the etched layer 158 form a completed circuit. The etching may be a control etching process that may completed to form or complete the embedded circuits in the substrate layer 155. Thus, the conductive circuit 152 may be formed as a result of the RDL circuit build up on the thin foil 127 which is then encapsulated by the insulative material such as a PID, an ABF film, prepreg, and mold compound. The embedded RDL circuits including die pads may then be completely formed and exposed after the releasable carrier 120 has been removed and the thin foil 127 that remains below the dielectric layer is etched away, as shown in FIG. 10.

Figure 11:
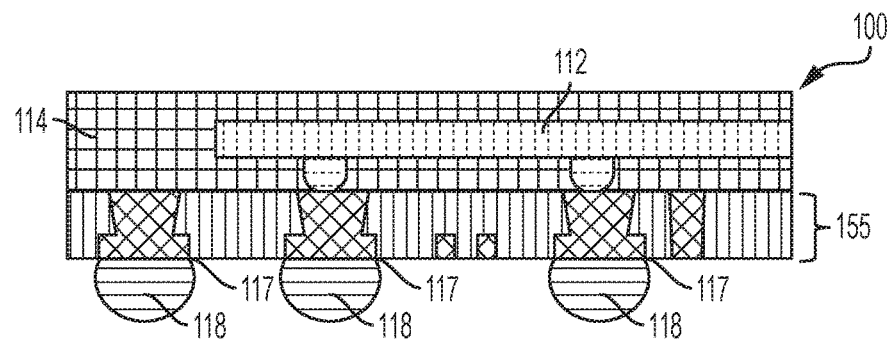
FIG. 11 depicts a side cutaway view of another step of the fabrication process of FIGS. 1-10 according to one embodiment.
Figure 12:
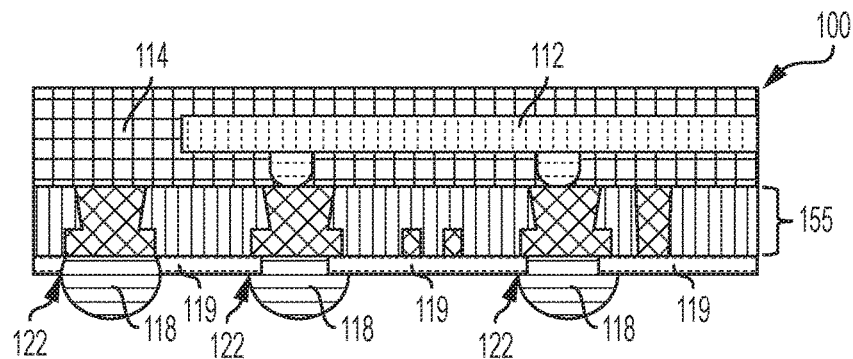
FIG. 12 depicts a side cutaway view of another step of the fabrication process of FIGS. 1-11 according to one embodiment.

Referring now to FIGS. 11 and 12, the recessed embedded conductive circuit 152 may form an opening for a ball grid array (BGA) ball attach process for completing the semiconductor device 100. In FIG. 11, the etched circuits may include solder ball attach locations 117 without solder masks for attachment to solder balls 118. In FIG. 12, the etched circuits may include solder mask defined (SMD) BGA ball attach. In particular, a solder mask material 119 may be applied in a manner creating a defined opening 122 for the solder balls 118.

Thus, the fabrication process described with respect to FIGS. 1-12 may be a hybrid assembly process, whereby the build-up and creation of the substrate 155 and the conductive circuit 152 are fabricated at the same time and location as the semiconductor die 112 is attached to the substrate 155. This process may create a completed semiconductor device 100 at the same time and in the same location. With the described hybrid assembly process, the substrate fabrication and the assembly process steps of attaching the semiconductor die 112 may be seamless and may occur on the same manufacturing line or by a single manufacturer. However, it should be understood that the carrier structure 10 may be utilized in other standard non-hybrid approaches as well.

It should be understood that the above steps described with respect to FIGS. 1-12 are an exemplary embodiment and that other fabrication processes which utilizes more, less or different steps are contemplated. For example, the carrier structure 10 may be utilized in the manner described in FIGS. 9-10 (e.g. using a thermal or UV adhesive) using a variety of different fabrication and packaging processes both before and after the release of the releasable carrier 120. Likewise, the concept of attaching the semiconductor die 112 prior to the underlying conductive circuit 152 being completed (i.e. before etching and/or before additional layers of substrate are applied) may be applicable in various other fabrication processes.

Further, the carrier structure 10 may be configured to allow for separation in a timely release sequence. The concept allows for separation at certain predetermined or preplanned stages in an assembly or fabrication process. In the embodiment above, the carrier structure 10 goes through RDL circuit patterning, dielectric build up, lamination and assembly (flip chip attach and molding). The phase where the releasable carrier 120 is separated from the package is after the molding process of the semiconductor die 112. The adhesive layer 129 or double sided tape is configured to maintain adhesion as the carrier goes through different processes, especially during heating steps such as reflow processes.

At this point in the process, the semiconductor die 112 is attached to the embedded substrate 155. The embedded substrate 155 has the first surface 156 and the second surface 157. The embedded substrate 155 includes the insulator material 107 and at least a portion of a conductive circuit 152 within the insulator material 107. The embedded substrate includes the etched layer 158 of the conductive etched thin foil 127. The etched layer 158 may be attached to the conductive circuit 152. The semiconductor die 112 is attached to the second surface 157 while the etched layer 158 of the conductive material is attached to the opposing first surface 156.

Thus, disclosed herein is a method for making a semiconductor device, such as the semiconductor device 100. The method may include patterning a conductive circuit, such as the conductive circuit 152 on a conductive layer layer, such as the thin foil 127. The method may include applying an insulator material, such as the insulative material 107, over the conductive circuit to create a substrate, such as the substrate 155, having a first surface and a second opposing surface, where the conductive layer layer is located on the first surface. The method may include attaching a semiconductor die, such as the semiconductor die 112, to the second surface of the substrate. The method may then include etching or removing the conductive layer layer to create a completed circuit. The method may include providing a releasable carrier, such as the releasable carrier 120, attached directly or indirectly to the conductive layer layer, encapsulating the semiconductor die after the attaching the semiconductor die, and removing the releasable carrier from the conductive layer layer after the encapsulating of the semiconductor die.

Another embodiment may include a method for making a semiconductor device, such as the semiconductor device 100. The method may include providing a releasable carrier, such as the releasable carrier 120, attached to a conductive layer, such as the thin foil 127. The method may include patterning a conductive circuit, such as the conductive circuit 152, on a surface of the conductive layer. The method may include applying an insulative material, such as the insulative material 107, at least partially covering the conductive circuit. The method may include releasing the releasable carrier from the conductive layer and facilitating the releasing with an activating source. This facilitating may occur without the activating source making physical contact with the releasable carrier. The method may include raising the temperature of an adhesive, such as the adhesive layer 129, located between the releasable carrier and the conductive layer, to a temperature between 150° C. and 300° C. The method may include attaching a semiconductor die, such as the semiconductor die 112, to at least portions of the conductive circuit. The method may include encapsulating the semiconductor die before the releasing the releasable carrier. The method may further include including activating the adhesive with the activating source to facilitate the releasing. The method may further include applying thermal release adhesive on one or both sides of a double sided tape of the adhesive. The method may alternatively or additionally include applying UV release on one or both sides of the double sided tape. Still further, the method may include removing the carrier foil layer from the thin foil layer after the releasable carrier has been released. Moreover, the method may include reusing the releasable carrier for making a second semiconductor device.

Figure 13:
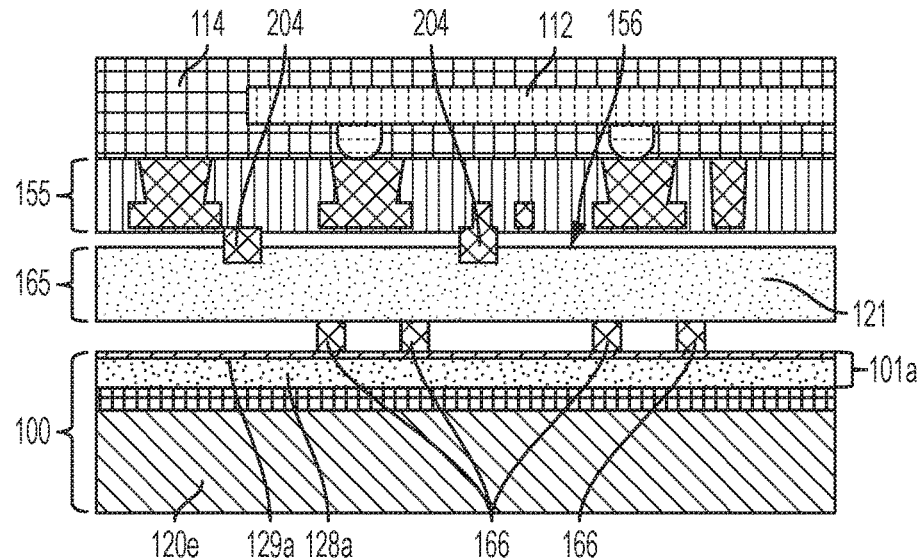
FIG. 13 depicts a side cutaway view of another step of a fabrication process according to one embodiment.
Figure 14:
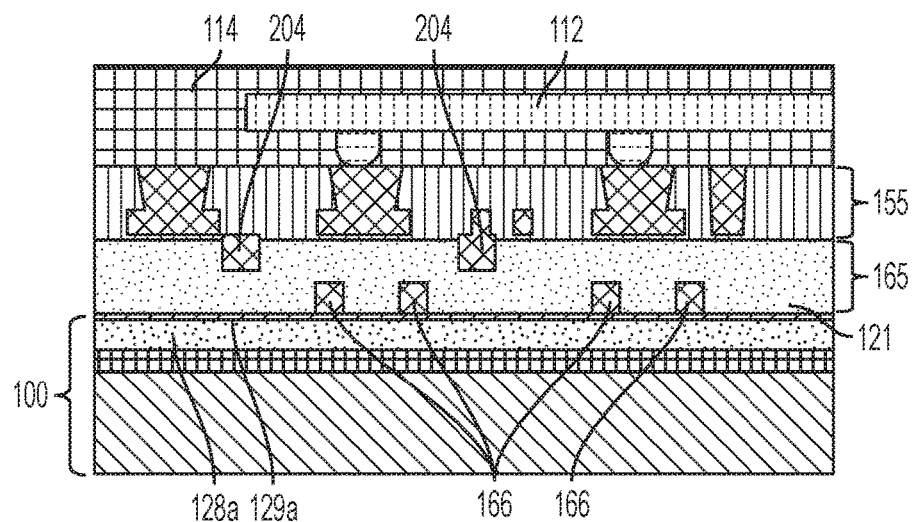
FIG. 14 depicts a side cutaway view of another step of the fabrication process of FIG. 13 according to one embodiment.
Figure 15:
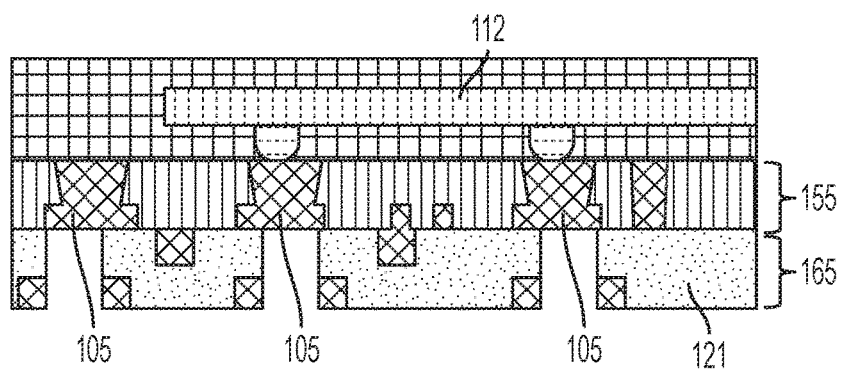
FIG. 15 depicts a side cutaway view of another step of the fabrication process of FIGS. 13-14 according to one embodiment.
Figure 16:
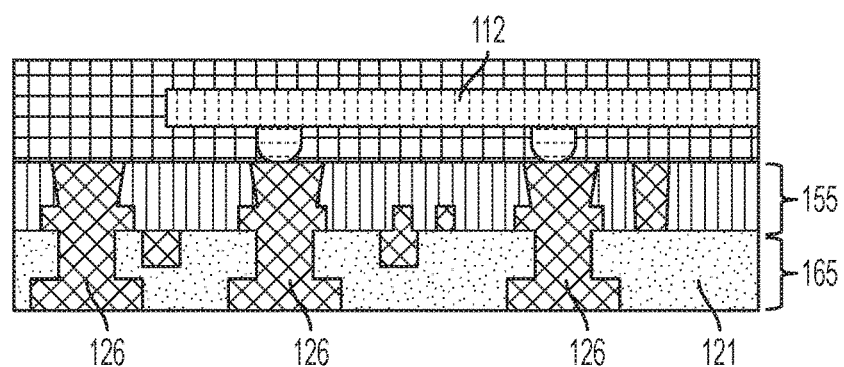
FIG. 16 depicts a side cutaway view of another step of the fabrication process of FIGS. 13-15 according to one embodiment.

Referring now to FIGS. 13-16 it is contemplated that the fabrication process may forgo steps 11 and 12 until after applying one or more additional substrate layers such as the second substrate layer 165 shown in FIGS. 13-14. In this process multi-substrate process, the semiconductor die 112 may be attached directly to the circuit pads at the structures 110 without removing the releasable carrier 120. If additional RDL layers are necessary, they may be formed by transfer process or by a build-up process after the releasable carrier 120 is removed as shown in FIGS. 13-16. FIG. 13 shows another carrier structure 10e similar or the same as the carrier structure 10. Here, an above plane circuit 204 may have already been applied adjacent or above the first surface 156, along with another insulative layer 121 which may include, for example, a thermal cure dielectric. The carrier structure 10e may include an annular ring structure 166 patterned on the conductive layers 101a. The thermal cure dielectric may be compressed, as shown in FIG. 14. Referring to FIG. 15, the releasable carrier 120e of the carrier structure 10a has been removed, along with the carrier foil layer 128a, exposing a thin foil layer, such as the polyester base material layer 129a, which has already been etched away. Laser ablate has been used to remove portions of the insulative material and to expose the top pads 105 in the first substrate 155. Vias 126 are filled with a conductive material in the step shown in FIG. 16. It should be understood that following the step shown in FIG. 16, additional layers may similarly applied. Furthermore, build-up layers by transfer method without a releasable carrier may be applied as well.

Figure 23A:
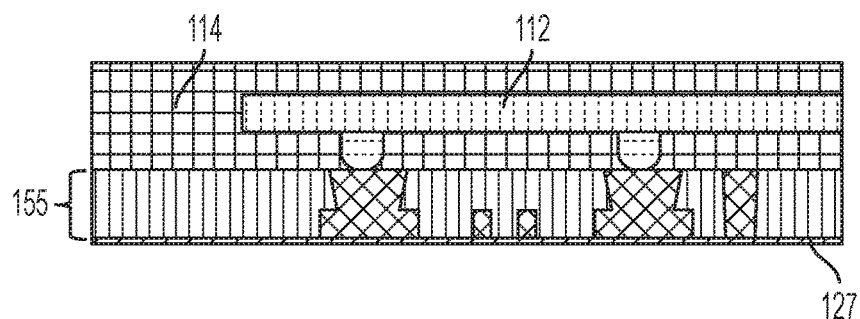
FIG. 23a depicts a side cutaway view of a step of a fabrication process in accordance with one embodiment.
Figure 23B:
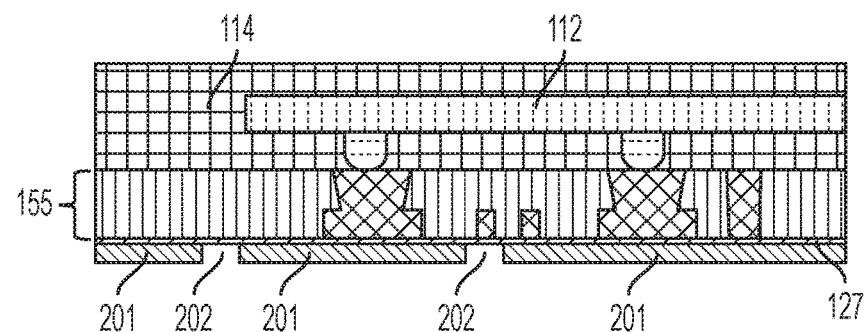
FIG. 23b depicts a side cutaway view of another step of the fabrication process of FIG. 23a in accordance with one embodiment.
Figure 23C:
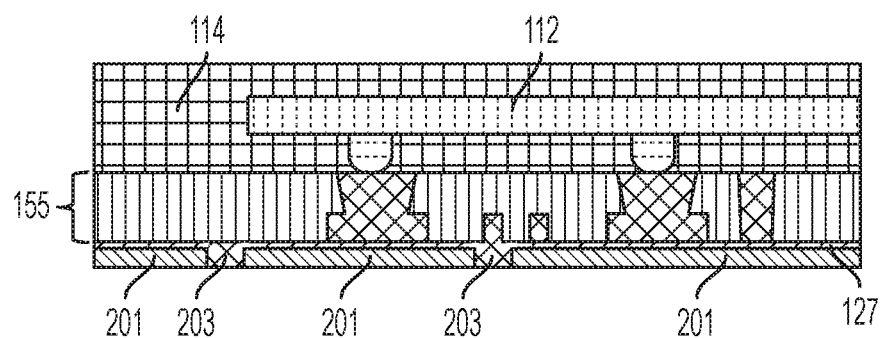
FIG. 23c depicts a side cutaway view of another step of the fabrication process of FIGS. 23a-23b in accordance with one embodiment.
Figure 23D:
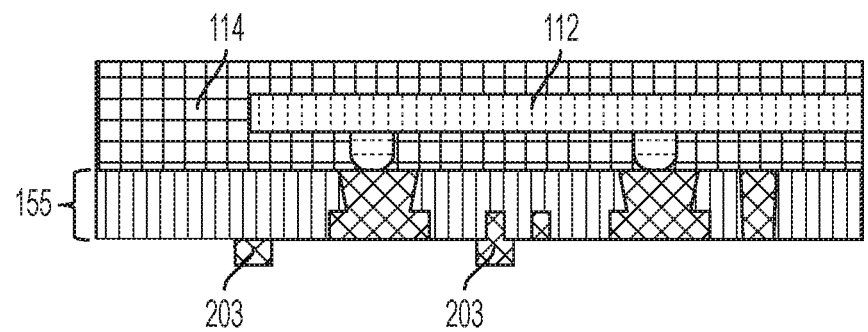
FIG. 23d depicts a side cutaway view of another step of the fabrication process of FIGS. 23a-23c in accordance with one embodiment.

FIGS. 23a, 23b, 23c and 23d show a process for above plane structures applied above the etched layer. FIG. 23a shows a step after the semiconductor die 112 has been encapsulated in the mold 114, after the carrier foil 128 has been removed but prior to the etching. At the step shown in FIG. 23b, a photoresist pattern 201 has been applied adjacent to the thin foil layer 127 with a plurality of photoresist openings 202, prior to etching. Once this pattern has been established, FIG. 23c shows that above place circuits 203 may be plated on the thin foil layer 127. Once this occurs, etching the thin layer 127 may be accomplished to create the above plane circuits 204, as shown in FIG. 23d. Other processes for above plane conductive circuits are contemplated including standard build up layering. For example, once the etched layer with above plane circuits has been applied, another standard build up layer may be applied. Once the encapsulating mold 114 has been applied about the semiconductor die 112 and hardens, the die may act as the structural support upon which to build additional layers in a standard build process.

Figure 24:
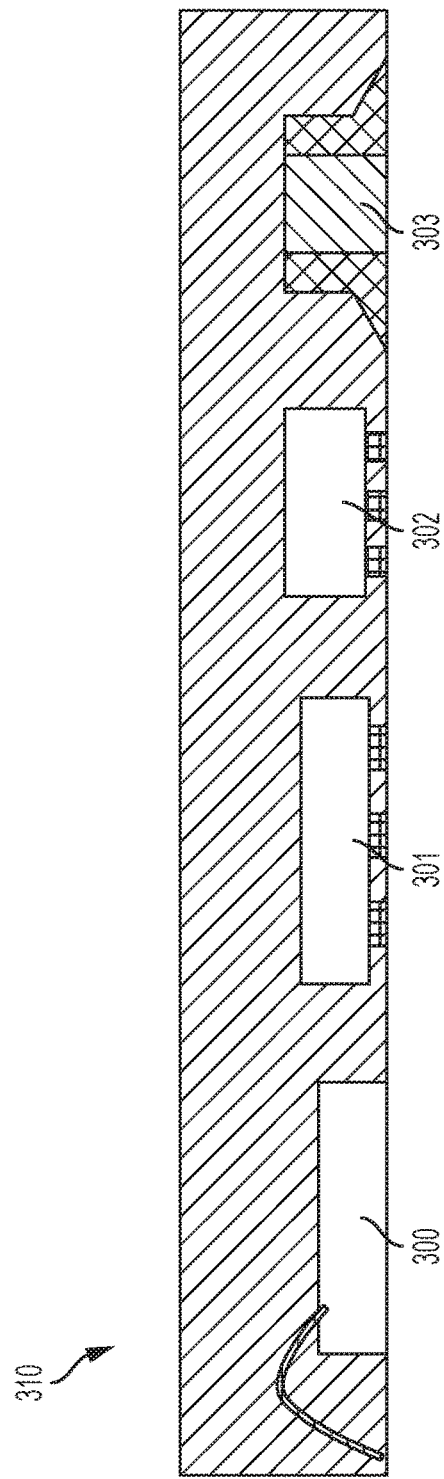
FIG. 24 depicts a side cutaway view of a system in package structure in accordance with one embodiment.

Referring to FIG. 24 package structure(s) with multiple active(s) and/or passive(s) combinations may be redistributed simultaneously. As shown, a wirebond 300, a flipchip 301, an IDP 302 and a passive component 303 are shown packaged together in a system in package (SIP) arrangement 310. This system in package approach as shown in FIG. 24 may be accomplished using the carrier structure 10 as described herein.

Figure 17:
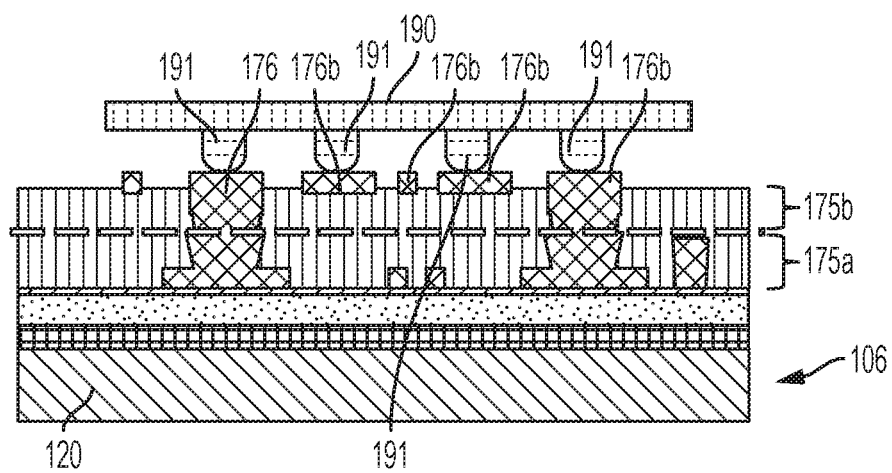
FIG. 17 depicts a side cutaway view of an option for a build-up of layers in a fabrication process according to one embodiment.

Referring now to FIG. 17, another embodiment is illustrated. In this embodiment, multiple RDL layers are formed on an underlying carrier structure 10b, the same or similar to the carrier structures 10, 10a. Here, embedded features may be located proximate to the BGA pads formed on the thin releasable foil of the carrier in a first substrate layer 175a. However, a second substrate layer 175b may be built upon the first substrate layer 175a using a standard build up process which results in at least some above plane conductive elements 176 which may be capture pads for receiving pillars or interconnects 191 of the semiconductor die 190. A dashed line is shown between layers 175a and 175b to highlight the difference in layers. However, it should be understood that this dashed line is imaginary and simply shown to demonstrate that there are two separate layers. Again, the attachment of the semiconductor die 190 may occur when the releasable carrier 120 remains attached before release in this embodiment.

Figure 26:
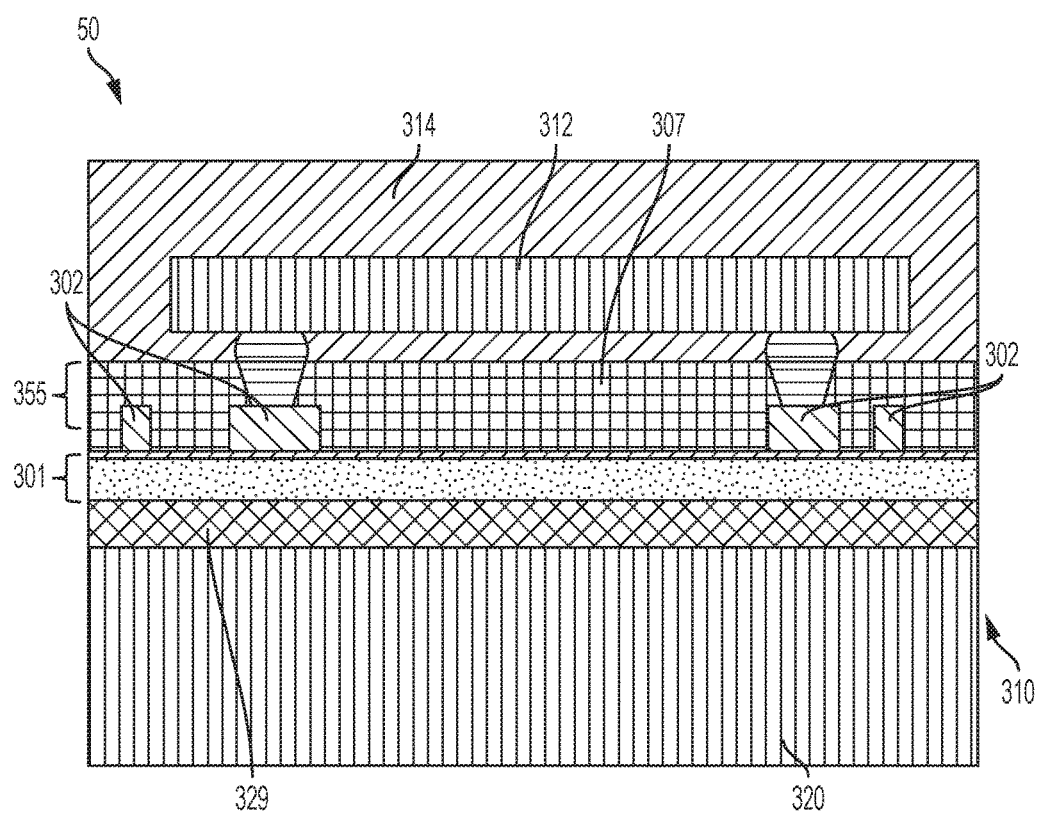
FIG. 26 depicts a double mold layering structure in accordance with one embodiment.

FIG. 26 shows another embodiment of another semiconductor device 50 that is at least partially fabricated in a manner consistent with that described herein above. This semiconductor device 50 includes a conductive circuit 352 and a first layer of insulative material which is a first mold material 307. A "mold" as described and used herein means a thermoplastic material having a substantial filler content. Additionally, a mold may mean a material having a substantial filler size as well. A mold material is further configured to protect the encapsulated conductive circuits 352. The first mold material 307 may encapsulate the conductive circuit 352 and may be configured to act as an electrical insulator and/or a dielectric. The conductive circuit 352 may be an embedded circuit that may eventually be completed by etching a thin foil layer, as described hereinabove. The first mold material and the encapsulated conductive circuit 352 may comprise a first substrate layer 355. The semiconductor device 50 may further include a semiconductor die 312 encapsulated within a second mold material 314. In other embodiments, the semiconductor die may be encapsulated within the first semiconductor material, such as the first mold material 307, that has been used to encapsulate the conductive circuit 352.

Consistent with the embodiments described hereinabove, semiconductor device 50 may be fabricated on a carrier structure 310 having a releasable carrier 320, an adhesive layer 329 and a releasable foil layer 301. The substrate 355 may be built upon the releasable carrier, which may include the adhesive layer 329 which may be thermally or UV activated. As shown, the semiconductor die 312 may be encapsulated with the second mold material 314 before the releasable carrier 320 has been removed or released from the substrate 355 and the package structure.

The first mold material 307 and the second mold material 314 may be a thermoplastic mold compound which is able to soften upon heating, and is capable of being hardened upon cooling. This softening and hardening may be repeatable for additional heat applications without compromising the integrity of the eventually hardened compound. This may be particularly advantageous for embodiments in the present invention, which may require additional heat applications for removing the releasable carrier 320, in the case that the adhesive layer 329 is a thermally releasable compound. The first mold material 307 may not be mixed with thermosetting dielectric materials. The first mold material 307 may function in a similar manner to thermosetting dielectric materials such as an ajinomoto build-up film (ABF) material and PID and other dielectric materials, but the first mold material 307 may actually be a thermoplastic compound. The first mold material 307 layer may also be thinner than the second mold material 314 layer, as the first mold material 307 is configured to function as a prepreg or dielectric encapsulate material.

In one embodiment, the second mold material 314 may be different than the first mold material 307. It may be particularly advantageous in some fabrication processes for the first mold material 307 to have a lesser filler content than the second mold material 314. Similarly, the first mold material 307 may have a filler size that is less than the second mold material 314. By having a greater filler content and filler size than the first mold material 307, the second mold material 314 material may prevent warpage and may be particularly advantageous. Having a lower filler content and filler size for the first mold material 307 may be desirable for achieving precise and thin fill dimensions necessary for creating substrate layers.

Overall, this double mold process may allow for packages with redistribution layers to be processed by the sole use of thermoplastic molding compounds and without the use of thermosetting dielectric materials, in one embodiment. There are benefits of using thermosetting mold compounds for the entire package structure resulting in less mismatch in material properties such as CTE, Tg, and resin rheology. This may allow the material and process adjustment to control warpage and other reliability concerns. The double mold process may be incorporated into current assembly line infrastructures already designed to handle mold compound materials. In the case of a multi-layer package design, the package construction may require a combination of thermosetting and thermoplastic materials. It should further be understood that dielectric substrate layers may be applied below the first substrate layer 355 once the carrier assembly 310 has been removed and the thin foil has been etched in the manner described hereinabove. Thus, the single substrate layer 355 adjacent to the semiconductor die 312 may be made with mold in the manner described herein, but additional layers may be built up in a standard build-up process using dielectric materials.

Another embodiment contemplated is a method of making a semiconductor device that includes providing a substrate, such as the substrate 355, that includes a first mold material, such as the first mold material 307, and a conductive circuit, such as the conductive circuit 352, in the first mold material. The method may include providing a semiconductor die, such as the semiconductor die 312. The method may include attaching the semiconductor die to the conductive circuit and encapsulating the semiconductor die with at least one of the first mold material or a second mold material, such as the second mold material 314. The method may include preventing the mixing of the first mold material with thermosetting dielectric materials. The method may include encapsulating the semiconductor die with the second mold material. The method may include created an embedded the conductive circuit by etching a conductive layer or sheet. The method may further include insulating an entire package structure of a semiconductor device by the sole use of one or more mold compounds. The method may further include providing a thermally activated releasable carrier, such as the releasable carrier 320, building a substrate, such as the substrate 355, upon the thermally activated releasable carrier, attaching the conductive circuit before the thermally activated releasable carrier is removed from the substrate. The method may include exposing the thermally activated releasable carrier to an appropriate temperature, and releasing the thermally activated releasable carrier.

Figure 27:
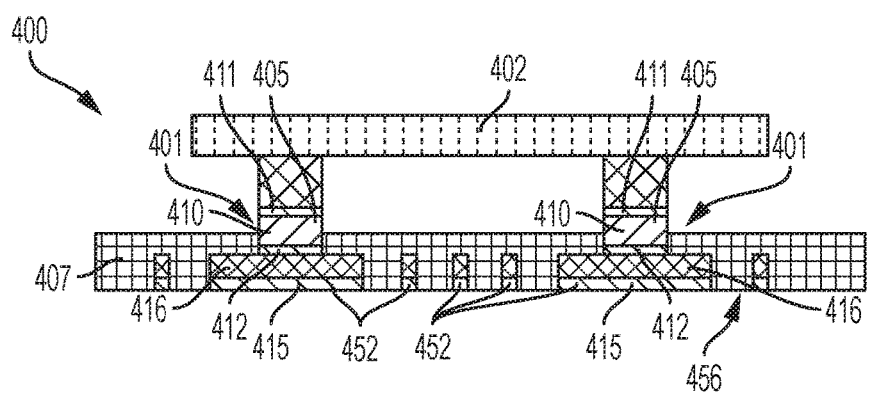
FIG. 27 depicts a interconnect joint layering structure in accordance with one embodiment.

FIG. 27 shows still another embodiment of a semiconductor device 400 having an interconnection joint structure 401. Shown is a semiconductor device 400 having a semiconductor die 402 at a stage in a fabrication process prior to encapsulation of the semiconductor die 402 with a mold. The package shown may be resting on a carrier structure (not shown) in a manner consistent with the embodiments of the carrier structures described herein above. Thus, a thin foil layer (not shown) may rest below a substrate 455 shown. The substrate 455 may include a conductive circuit 452 and an insulative material 407. The substrate 455 may further include a first surface 456 that is adjacent to the conductive layer or other base and a second surface 457 that is proximate or facing the semiconductor die 402. The semiconductor die 402 is shown attached to the substrate above or proximate the second adjacent to the second surface 457.

The semiconductor device 400 may include the interconnect joint structure 401 in the substrate 455 creating a capture pad 405. The interconnect joint structure 401 may include a copper layer 410 and an adjacent top nickel layer 411 and an adjacent bottom nickel layer 412. Thus, the interconnect joint structure 401 may define a capture pad 405 which includes the first nickel layer 411 followed by the copper layer 410 and the second nickel layer 412. This interconnect joint structure 401 may be found in a single layer of the insulative material 407 or a single applied layer of the substrate 455. The semiconductor die 402 may be attached to the substrate 455 in this manner without a via. In one embodiment, the substrate 455 and the interconnect joint structure 401 may be formed using a build-up process. In another embodiment, a subtractive process may be utilized (i.e. with laser ablation of the insulative material, for example).

The nickel layers 411, 412 may be plated layers that are particularly configured to protect during solder or pillar attachment of the semiconductor die 402 when very thin insulative encapsulation layers are necessary. For example, if the insulative layer 407 is very thin (i.e. below 12 μm thick), the insulative layer 407 (e.g. dielectric, PID or ABF film) may act as a soldermask defined (SMD) for the pad opening. The nickel layers 411, 412 may provide a barrier to prevent copper consumption by solder (Sn—Pb) during joint intermetallic formation using pillars 420 and solder balls (as shown in FIG. 28).

An additional nickel layer 415 may be provided adjacent to the first surface 456. This nickel layer 415 may function as an etch stop barrier during thin foil etching from a carrier structure as described hereinabove. A copper layer 416 may be provided above the nickel layer 415. The nickel layer 415 may control the integrity of fine line circuits (e.g. 2 μm) of the conductive circuit 452 from over etching and poor etching tolerances. Other suitable plating materials are also contemplated other than nickel to provide a barrier, such as zinc.

Figure 28:
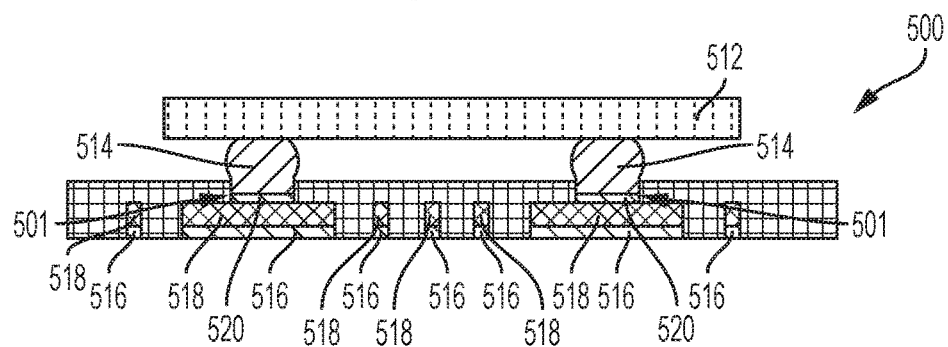
FIG. 28 depicts another interconnect joint layering structure in accordance with one embodiment.

Referring now to FIG. 28, an embodiment is shown similar to the embodiment shown in FIG. 27. Here, a semiconductor device 500 is shown having a semiconductor die 512 with solder balls 514. This embodiment shows an interconnect joint structure 501 that may be applicable to instances when the semiconductor die 512 includes the solder balls 514 instead of the copper pillar 420, and where the insulator acts as a soldermask defined. In this embodiment, a single layering process including a first nickel layer 516 followed by a copper layer 518 and another nickel layer 520 are shown to create the interconnect 501. Further, the first nickel layer 516 may be applied to all of the conductive elements to act as an etch barrier, as shown.

Another embodiment includes a method for making a semiconductor device that includes providing a substrate, such as the substrate 455, and an insulative layer, such as the insulative material 107 over the conductive circuit. The method may include forming a capture pad, such as the capture pad 405, in the substrate including a first layer of nickel, such as the first nickel layer 411, a layer of copper over the first nickel layer, such as the layer of copper 410, and a second layer of nickel over the layer of copper, such as the second layer of nickel 412. The method may include etching a layer of copper foil, such as the thin foil on a surface of the substrate. The method may include including the first layer of nickel, the layer of copper, and the second layer of nickel within a single layer of the insulator. The method may include providing a semiconductor die, such as the semiconductor die 512, and attaching the semiconductor die to at least a portion of the conductive circuit without a via. The method may include providing a nickel layer, such as the nickel layer 415, in the substrate to act as an etch stop barrier between the etched foil layer and the conductive circuit. The method may include the semiconductor die including solder balls, such as the solder balls 514, and attaching the solder balls to at least one of the first and second layers of nickel.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

I claim:

1. A semiconductor device comprising:
    a semiconductor die;
    a substrate including a first surface and a second surface, the substrate comprising a conductive circuit and an insulative material over the conductive circuit, wherein the semiconductor die is attached to the second surface; and
    an interconnect joint structure in the substrate creating a capture pad including a middle copper layer, an adjacent top nickel layer, and an adjacent bottom nickel layer.

2. The semiconductor device of claim 1, wherein the conductive circuit includes an etched layer of conductive foil that is located on the first surface of the substrate.

3. The semiconductor device of claim 1, wherein the interconnect joint structure is found in a single layer of the insulative material.

4. The semiconductor device of claim 1, wherein the semiconductor die is attached to the substrate without a via.

5. The semiconductor device of claim 1, wherein the substrate and interconnect joint structure are formed using a build-up process.

6. The semiconductor device of claim 1, wherein the substrate and interconnect joint structure are formed using a subtractive process.

7. The semiconductor device of claim 1, wherein the insulative material comprises a layer that is less than 12 μm thick.

8. The semiconductor device of claim 1, wherein the substrate further includes an etched foil layer, and wherein the substrate further includes a nickel layer etch stop barrier between the conductive circuit and the etched foil layer.

9. The semiconductor device of claim 1, wherein the semiconductor die includes solder bumps for attachment to the interconnect joint structure.

10. A semiconductor device comprising:
    a semiconductor die;
    a substrate including a first and a second surface, the second surface attached to the semiconductor die, the substrate comprising a conductive circuit and an insulative material over the conductive circuit; and
    an interconnect joint structure in the substrate including a middle copper layer, an adjacent top nickel layer, and an adjacent bottom nickel layer, wherein the interconnect joint structure is found within a single layer of the insulative material.

11. The semiconductor device of claim 10, wherein the interconnect joint structure creates a capture pad.

12. The semiconductor device of claim 10, wherein the conductive circuit includes an etched layer of conductive foil that is located on the first surface of the substrate.

13. A method for making a semiconductor device comprising:
    providing a substrate including conductive circuit and an insulative material over the conductive circuit; and
    forming a capture pad in the substrate including a first layer of nickel, a layer of copper over the first layer of nickel, and a second layer of nickel over the layer of copper.

14. The method of claim 13, further comprising etching a layer of copper foil on a surface of the substrate.

15. The method of claim 13, further comprising including the first layer of nickel, the layer of copper, and the second layer of nickel within a single layer of the insulative material.

16. The method of claim 13, further comprising providing a semiconductor die and attaching the semiconductor die to at least a portion of the conductive circuit without a via.

17. The method of claim 13, wherein the insulative material is at least one of a photo-imagable dielectric and ABF film.

18. The method of claim 13, wherein the insulative material is less than 12 μm thick.

19. The method of claim 14, further comprising providing a nickel layer in the substrate to act as an etch stop barrier between the etched foil layer and the conductive circuit.

20. The method of claim 16, wherein the semiconductor die includes solder balls, the method further including attaching the solder balls to at least one of the first and second layers of nickel.

* * * * *